United States Patent
Yang et al.

(10) Patent No.: US 9,971,530 B1
(45) Date of Patent: May 15, 2018

(54) STORAGE SYSTEM AND METHOD FOR TEMPERATURE THROTTLING FOR BLOCK READING

(71) Applicant: SanDisk Technologies LLC, Plano, TX (US)

(72) Inventors: Nian Niles Yang, Mountain View, CA (US); Grishma Shah, Milpitas, CA (US); Philip Reusswig, Mountain View, CA (US); Sahil Sharma, San Jose, CA (US); Nan Lu, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days. days.

(21) Appl. No.: 15/347,552

(22) Filed: Nov. 9, 2016

(51) Int. Cl.
| | |
|---|---|
| *G06F 3/06* | (2006.01) |
| *G11C 16/28* | (2006.01) |
| *G11C 16/10* | (2006.01) |
| *G11C 16/16* | (2006.01) |
| *G11C 16/34* | (2006.01) |

(Continued)

(52) U.S. Cl.
CPC ............ *G06F 3/0619* (2013.01); *G06F 3/064* (2013.01); *G06F 3/0653* (2013.01); *G06F 3/0679* (2013.01); *G06F 11/004* (2013.01); *G06F 11/3034* (2013.01); *G06F 11/3058* (2013.01); *G11C 16/10* (2013.01); *G11C 16/16* (2013.01); *G11C 16/28* (2013.01); *G11C 16/3459* (2013.01); *G06F 2201/81* (2013.01)

(58) Field of Classification Search
CPC ......... G11C 7/04; G06F 3/061; G06F 3/0655; G06F 3/0688; H01L 23/34
See application file for complete search history.

(56) References Cited

U.S. PATENT DOCUMENTS

| | | | | |
|---|---|---|---|---|
| 2012/0224425 | A1* | 9/2012 | Fai | ................ G11C 11/5642 365/185.09 |
| 2015/0373876 | A1* | 12/2015 | Berke | .................. G05B 15/02 700/282 |

(Continued)

OTHER PUBLICATIONS

Mikolajick et al., "Characterisation of retention properties of charge-trapping memory cells at low temperatures", $5^{th}$ International EEIGM/AMASE/FORGEMAT Conference on Advanced Materials Research IOP Publishing, IOP Conf. Series: Materials Science and Engineering 5 (2009) 012026, © 2009 IOP Publishing Ltd., 5 pages.

(Continued)

*Primary Examiner* — Ajay Ojha
(74) *Attorney, Agent, or Firm* — Brinks Gilson & Lione

(57) ABSTRACT

A storage system and method for temperature throttling for block reading are provided. In one embodiment, a storage system is provided comprising a memory comprising a plurality of word lines and a controller in communication with the memory. The controller is configured to determine whether a temperature of the memory is above a first threshold temperature; and in response to determining that the temperature of the memory is above the first threshold temperature: apply a voltage to the plurality of word lines; and after the voltage has been applied, read one of the plurality of word lines. Other embodiments are possible, and each of the embodiments can be used alone or together in combination.

20 Claims, 8 Drawing Sheets

(51) Int. Cl.
*G06F 11/00* (2006.01)
*G06F 11/30* (2006.01)

(56) References Cited

U.S. PATENT DOCUMENTS

2016/0162219 A1* 6/2016 Erez .................... G06F 3/0653
 711/103
2016/0180959 A1* 6/2016 Darragh ................ G06F 3/0653
 365/185.09
2016/0320971 A1* 11/2016 Postavilsky ........... G06F 3/0604

OTHER PUBLICATIONS

P. Olivo et al., "Reliability of 3D NAND Flash Memories", Chapter 2, © Springer Science+Business Media Dordrecht 2016, pp. 29-62.

* cited by examiner

STORAGE SYSTEM AND METHOD FOR TEMPERATURE THROTTLING FOR BLOCK READING

BACKGROUND

Some storage systems (e.g., solid state drives (SSDs)) use a three-dimensional memory technology, such as BiCS (Bit Cost Scaling), that uses a charge trapping layer to store data. Due to the physics involved in such memory, it is possible for "shallow traps" to occur. Electrons in "shallow traps" can escape over time, which can result in a charge reduction that can cause read errors.

DETAILED DESCRIPTION

Overview

Figure 1A:
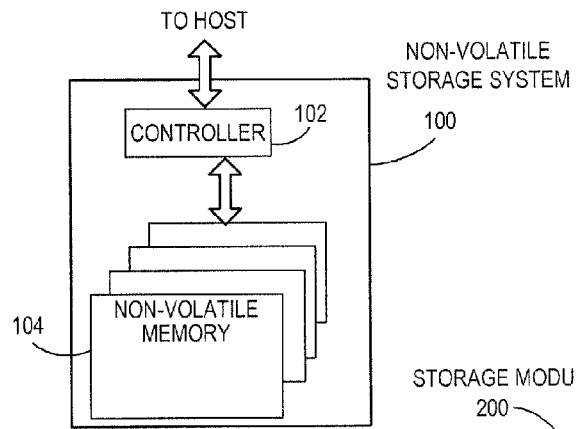
FIG. 1A is a block diagram of a non-volatile storage system of an embodiment.

By way of introduction, the below embodiments relate to a storage system and method for temperature throttling for block reading.

In one embodiment, a storage system is provided comprising a memory comprising a plurality of word lines and a controller in communication with the memory. The controller is configured to determine whether a temperature of the memory is above a first threshold temperature; and in response to determining that the temperature of the memory is above the first threshold temperature: apply a voltage to the plurality of word lines; and after the voltage has been applied, read one of the plurality of word lines.

In some embodiments, the controller is configured to apply the voltage to the plurality of word lines by sending a CFh prefix to the memory.

In some embodiments, the controller is further configured to: in response to determining that the temperature of the memory is below the first threshold temperature but above a second threshold: perform a dummy read of one of the plurality of word lines; and after the dummy read has been performed, perform an actual read of the one of the plurality of word lines.

In some embodiments, the controller is further configured to perform the dummy read by performing a single level cell sensing without a data transfer.

In some embodiments, the memory array is more likely to contain a higher error rate at the first threshold temperature than at the second threshold temperature.

In some embodiments, the controller is further configured to: in response to determining that the temperature of the memory is below the second threshold, perform an actual read of the one of the plurality of word lines without pre-applying a voltage to the plurality of word lines or performing a dummy read of the one of the plurality of word lines.

In some embodiments, the memory comprises a three-dimensional memory.

In some embodiments, the storage system is embedded in a host.

In some embodiments, the storage system is removably connected to a host.

In another embodiment, a method that is performed in a storage system comprising a memory having a plurality of word lines. The method comprises detecting a temperature of the memory; determining whether the temperature is in a first temperature range; and in response to the temperature of the memory being in the first temperature range: transitioning the plurality of word lines from a first read mode to a second read mode; and after the plurality of word lines have been transitioned from the first read mode to the second read mode, reading one of the plurality of word lines.

In some embodiments, the plurality of word lines are transitioned from the first read mode to the second read mode by applying a voltage to the plurality of word lines.

In some embodiments, the method further comprises determining whether the temperature is in a second temperature range; and in response to the temperature of the memory being in the second temperature range, pre-conditioning one of the plurality of word lines by applying a pre-read voltage to the one of the plurality of word lines before applying a read voltage to read the one of the plurality of word lines.

In some embodiments, the memory array is more likely to contain a higher error rate at the first temperature range than at the second temperature range.

In some embodiments, the method further comprises determining whether the temperature is in a third temperature range; and in response to the temperature of the memory being in the third temperature range, reading one of the plurality of word lines without attempting to transition the one of the plurality of word lines from the first read mode to the second read mode.

In some embodiments, the memory comprises a three-dimensional memory.

In some embodiments, the storage system is embedded in a host.

In some embodiments, the storage system is removably connected to a host.

In another embodiment, a storage system is provided comprising a memory comprising a plurality of word lines; and means for reducing a failed bit count of a word line by precondition the word line with voltage in response to a temperature of the memory exceeding a threshold.

In some embodiments, the memory comprises a three-dimensional memory.

In some embodiments, the storage system is embedded in a host.

In some embodiments, the storage system is removably connected to a host.

Other embodiments are possible, and each of the embodiments can be used alone or together in combination. Accordingly, various embodiments will now be described with reference to the attached drawings.

Embodiments

Figure 1B:
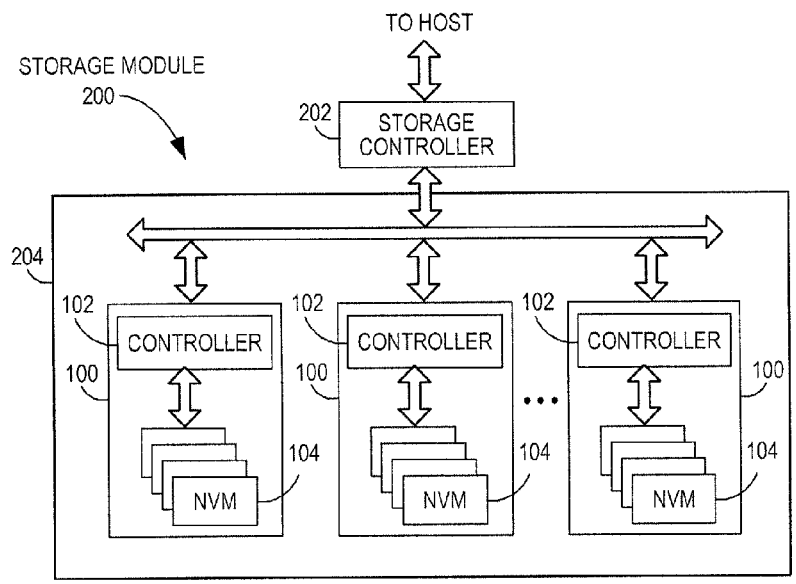
FIG. 1B is a block diagram illustrating a storage module of an embodiment.
Figure 1C:
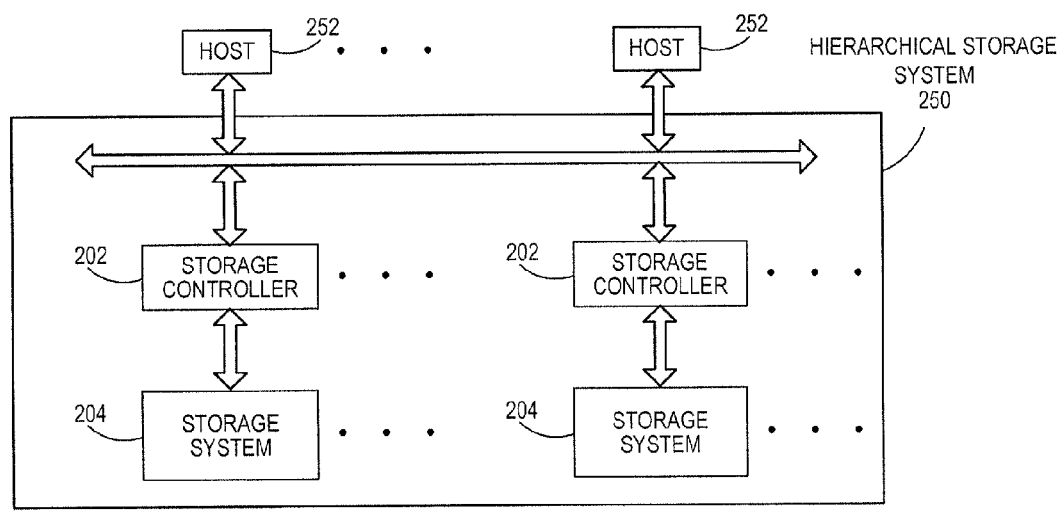
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
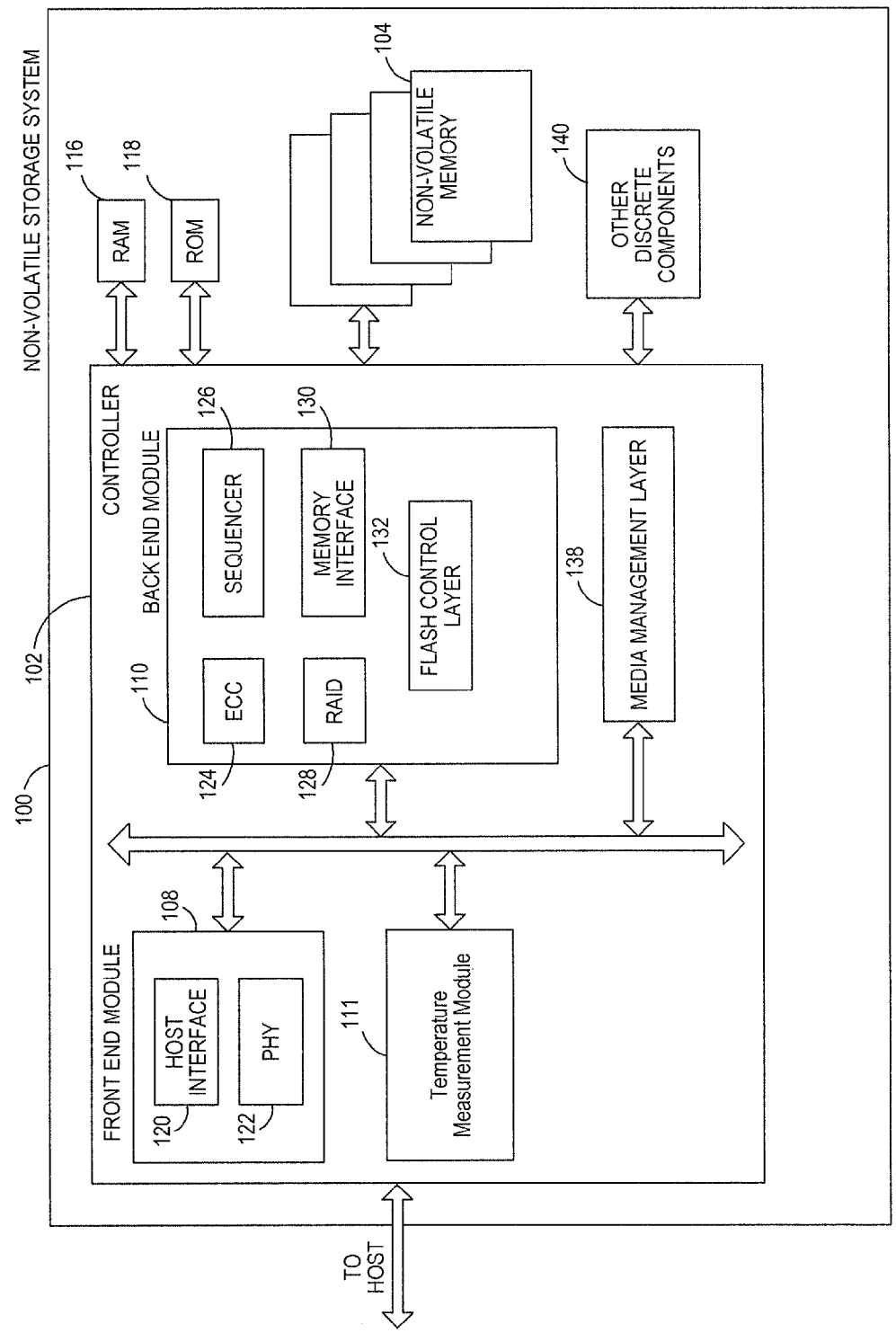
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include a temperature measurement module 111, which is discussed in more detail below, and can be implemented in hardware or software/firmware.

Referring again to modules of the controller 102, a buffer manager/bus controller manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
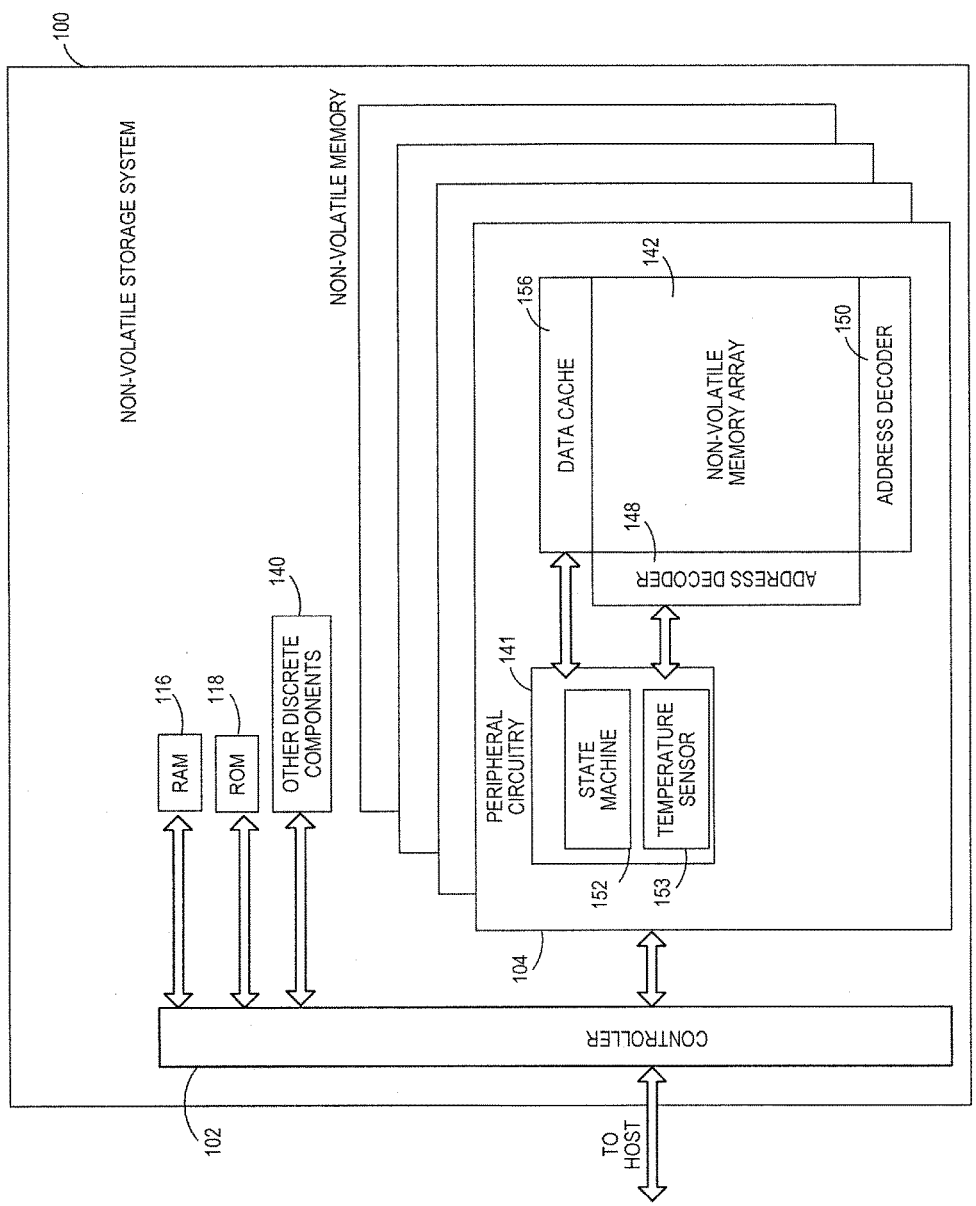
FIG. 2B is a block diagram illustrating components of the non-volatile memory storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to the controller 102 and a temperature sensor 153 that can detect the temperature of the memory. Any suitable technology can be used to implement the temperature sensor 153, including technology currently employed in conventional memory temperature sensors. Non-volatile memory die 104 further includes a data cache 156 that caches data.

Figure 3:
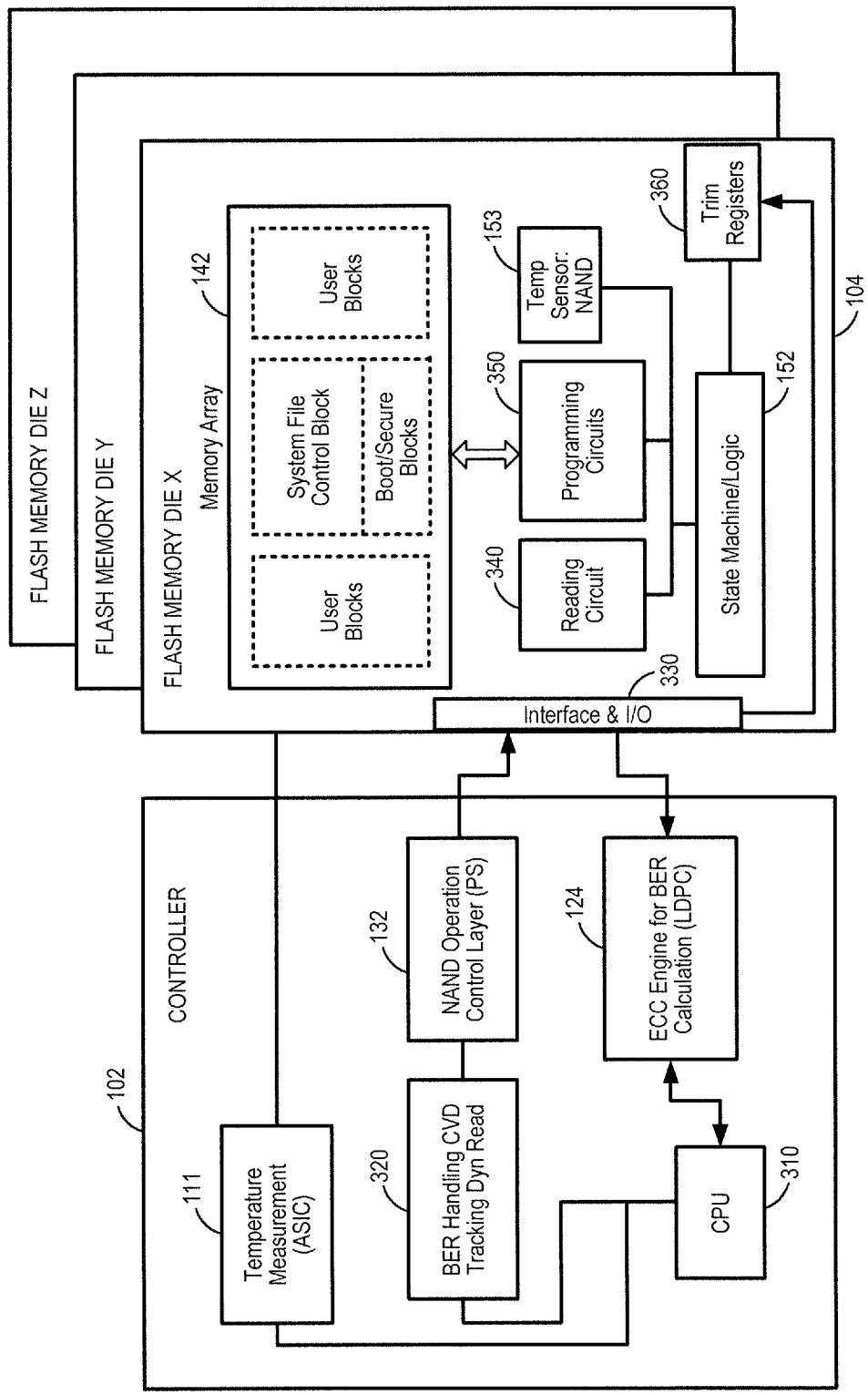
FIG. 3 is a block diagram of a non-volatile storage system of an embodiment.

FIG. 3 is a block diagram of one particular implementation of the controller 102 and memory 104 of an embodiment. As shown in FIG. 3, the controller 102 in this embodiment comprises the temperature measurement module 111 (here, an ASIC), ECC engine 124 (here, configured to perform a bit error rate (BER) calculation using a low-density parity-check (LDPC)), and the NAND operation control layer 132. The controller 102 in this embodiment also comprises a central processing unit (CPU) 310 for controlling the various components and for executing software/firmware stored in the controller 102 or memory 104 and a module 320 that is configured to perform bit error rate (BER) handling, Vt (threshold) distribution (CVD) tracking, and dynamic reads. This module 320 can be used to assist the controller 102 in various ways. For example, when the controller 102 reads a block that may have its own specific read condition, this module 320 can be used to remember that read condition. The memory 104 comprises the memory array 142 (here, arranged into user blocks, system file control blocks, and boot/secure blocks), state machine 152, and temperature sensor 153 noted above. The memory 104 also comprises an interface and I/O 330 for communicating with the controller 102, reading and programming circuits 340, 350, and trim registers 360. Of course, this is just one implementation, and other implementations are possible.

As noted above, some storage systems (e.g., solid state drives (SSDs)) use a three-dimensional memory technology, such as BiCS (Bit Cost Scaling), ReRAM, and X-point memory, to store data in a charge trapping layer. After the storage system injects enough electrons into the charge trapping layer of a memory cell to reach a target program level, it is possible for some residual charge to be trapped in the memory cell. Over time, this residual charge will leak away due to the floating body nature of the memory. The term "shallow traps" refers to the situation where residual charge is trapped in the memory storage layer of the memory cell. This residual charge can escape over time, which can result in a reduction of charge in the memory cell that can cause read errors. That is, the number of electrons present in the memory cell during a program verification read immediately after programming will be greater than the number of electrons present in the memory cell when the memory cell is read at some time later. Depending on how much residual charge was initially present during the read to program verify and how much residual charge escaped, the amount of charge detected in a subsequent read may be less than the program threshold level, resulting in the memory cell being read incorrectly as unprogrammed.

Figure 4:
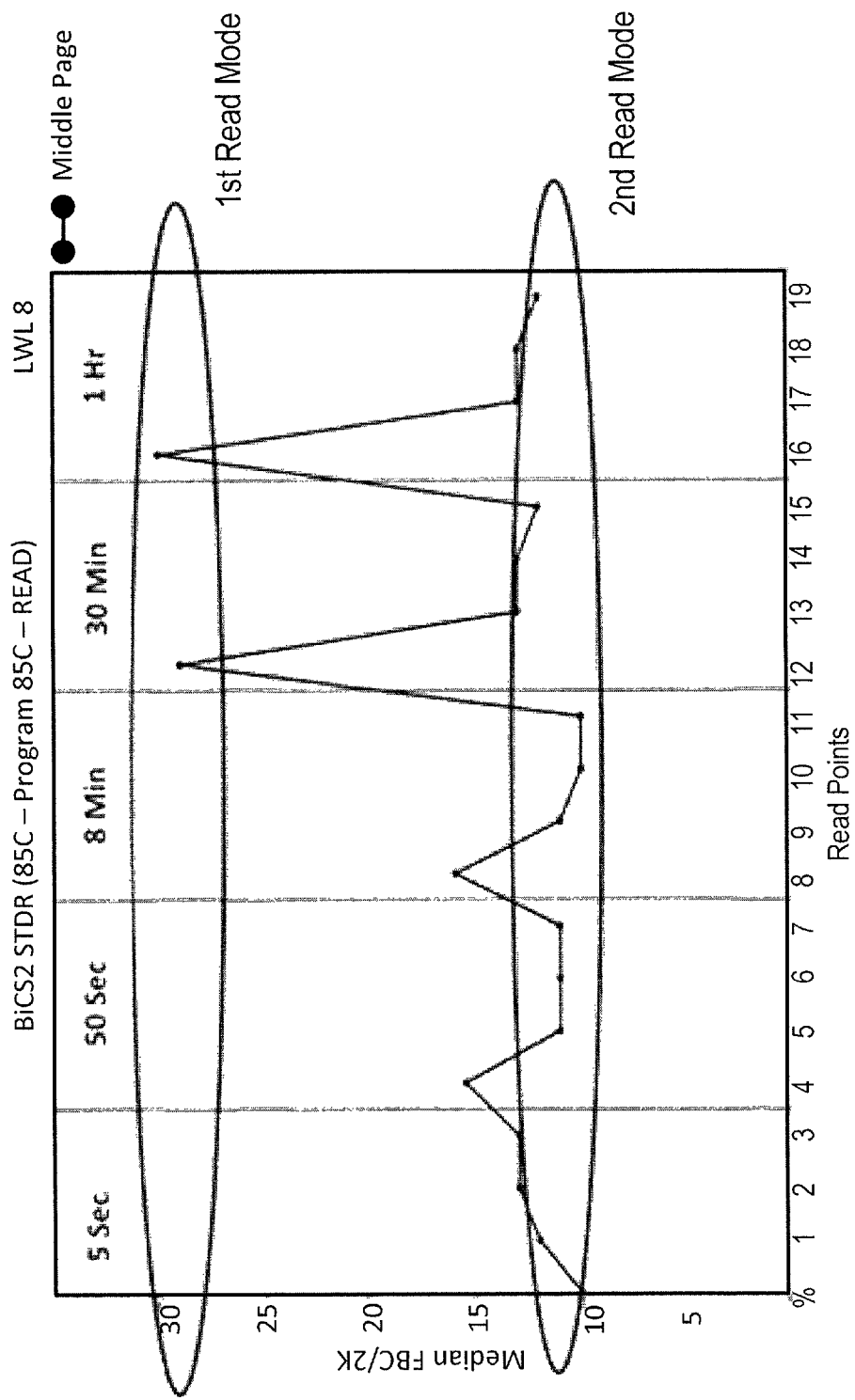
FIG. 4 is a graph of failed bit count versus read points of an embodiment.

FIG. 4 is a graph of failed bit count per 2 KB versus read points of an embodiment that illustrates the above program and related issues. This graph is based on reads of a middle page of a word line (WL8) of a memory that is at 85° C. The lower circle in the graph represents a target failed bit count range for any read of the memory cell. This lower circle is labeled "second read mode" and refers to the failed bit count range that is desired the first time the memory is accessed immediately after programming (e.g., the read performed during the write verify step). The upper circle is labeled "first read mode" and refers to the failed bit count range that is unacceptable in this storage system.

As shown in this graph, the failed bit count number generally increases over time, as residual charge leaks away from shallow traps. This graph also shows that, as time goes on, the failed bit count number generally decreases after each read. This is because applying a voltage on the word line to read a memory cell causes ambient electrons to be attracted into the shallow trap of the memory cell. However, as also shown in the graph, these electrons will eventually migrate out of the shallow trap, causing the failed bit count number to increase (i.e., making the memory cell appear to be less programmed under the same read conditions). Further, this migration gets worse over time. In this example, until about eight minutes after programming, a read will cause the failed bit count number to return firmly to the target "second read mode" range. However, after about eight minutes after programming in this example, the failed bit count number reaches the undesirable "first read mode" range, and a read barely brings the failed bit count number back to the upper limit of the desired "second read mode" range.

Figure 5:
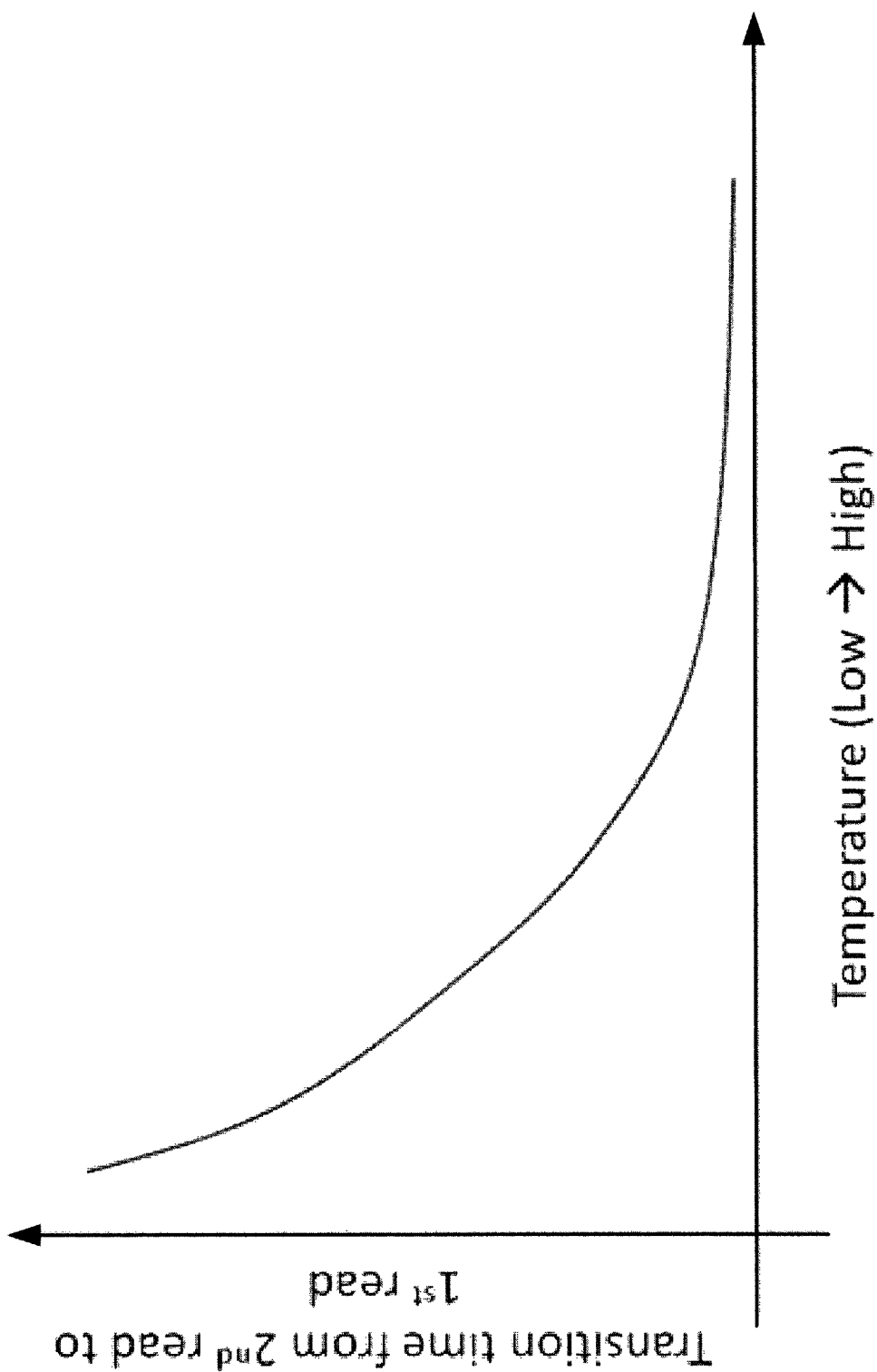
FIG. 5 is a graph of transition time versus temperature of an embodiment.
Figure 6:
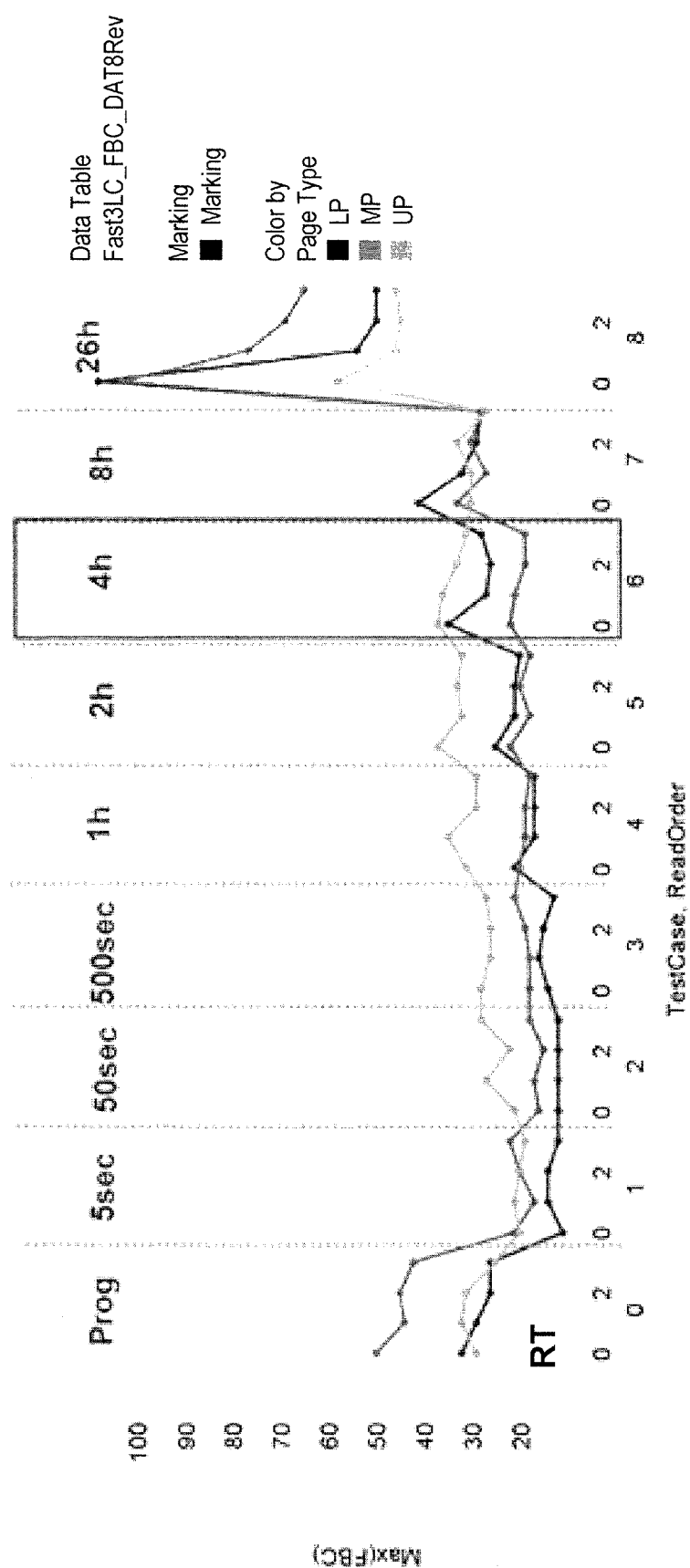
FIG. 6 is a graph of failed bit count versus read points of an embodiment.

In addition to time, temperature of the memory plays a factor in this problem. As shown in the graph in FIG. 5, the transition from having a failed bit count number in the desired "second read mode" range to the undesirable "first read mode" range occurs faster at the higher the temperature. The temperature of the memory can increase as the memory is in use (e.g., an increase in temperature of about 1° C. per second, in some situations). FIG. 6 shows a graph similar to FIG. 4, but the data in FIG. 6 was taken at a temperature of 45° C. instead of 85° C. (FIG. 6 also show data for upper and lower pages, in addition to data for a middle page). As shown by a comparison of these figures, the failed bit count is mostly flat for 8 hours after programming at 45° C., whereas the failed bit count is mostly flat for only 30 minutes at 85° C.

Accordingly, advanced solid state drive (SSD) systems that use 3D NAND flash memory, such as BiCS, are more sensitive to temperature. At the same time, the bit error rate is dependent on the time elapsed since the block was last accessed (e.g., program or read), which is the first read mode problem mentioned above. Also, the elapsed time during which the block transitions from second read mode condition (the condition of the block right after it has been programmed when there is a still shallowly-trapped electrons in the memory cell) to the first read mode condition (the condition of the block where shallowly-trapped electrons are de-trapped) is a strong function of temperature. This presents a two two-dimensional problem to deal with (temperature and time) to optimize the read operation so that complicated, high performance systems can have a smooth bit error rate across various temperatures, leading to less ECC or high BER disruption in the system.

To address this issue, one embodiment provides a preventative countermeasure solution to the first read mode problem with respect to the temperature. This is in contrast to prior systems that only use reactive measures (e.g., system level dynamic read when there is an uncorrectable error or a high bit error rate). More specifically, in this embodiment, the controller 102 uses temperature information measured by the system on the NAND die at read to decide if the fast transition from the second read mode to the first read mode has probably taken place. If it has, the controller 102 can send a pre-conditioning command (e.g., a CFh command) prior to a read command to apply a pre-conditioning voltage to a plurality of word lines in a reading block in order to move the memory cells into the second read mode condition. Once the memory cell is in the second read mode condition, the BER will be in line with the expected BER target values for the block according to CVD tracking or dynamic read algorithms.

As used herein, a CFh command refers to a particular prefix command sent prior to the actual read command applied to the memory. More generally, the command can be referred to a command that indicates that there is a pre-conditioning step used to put the entire reading block into the second read mode. This step can be optionally part of the read operation using an extra step before the read itself. This extra step can apply a substantial voltage to the entire wordline population of a block. As noted above, this extra step can be implemented using a CFh prefix command.

Figure 7:
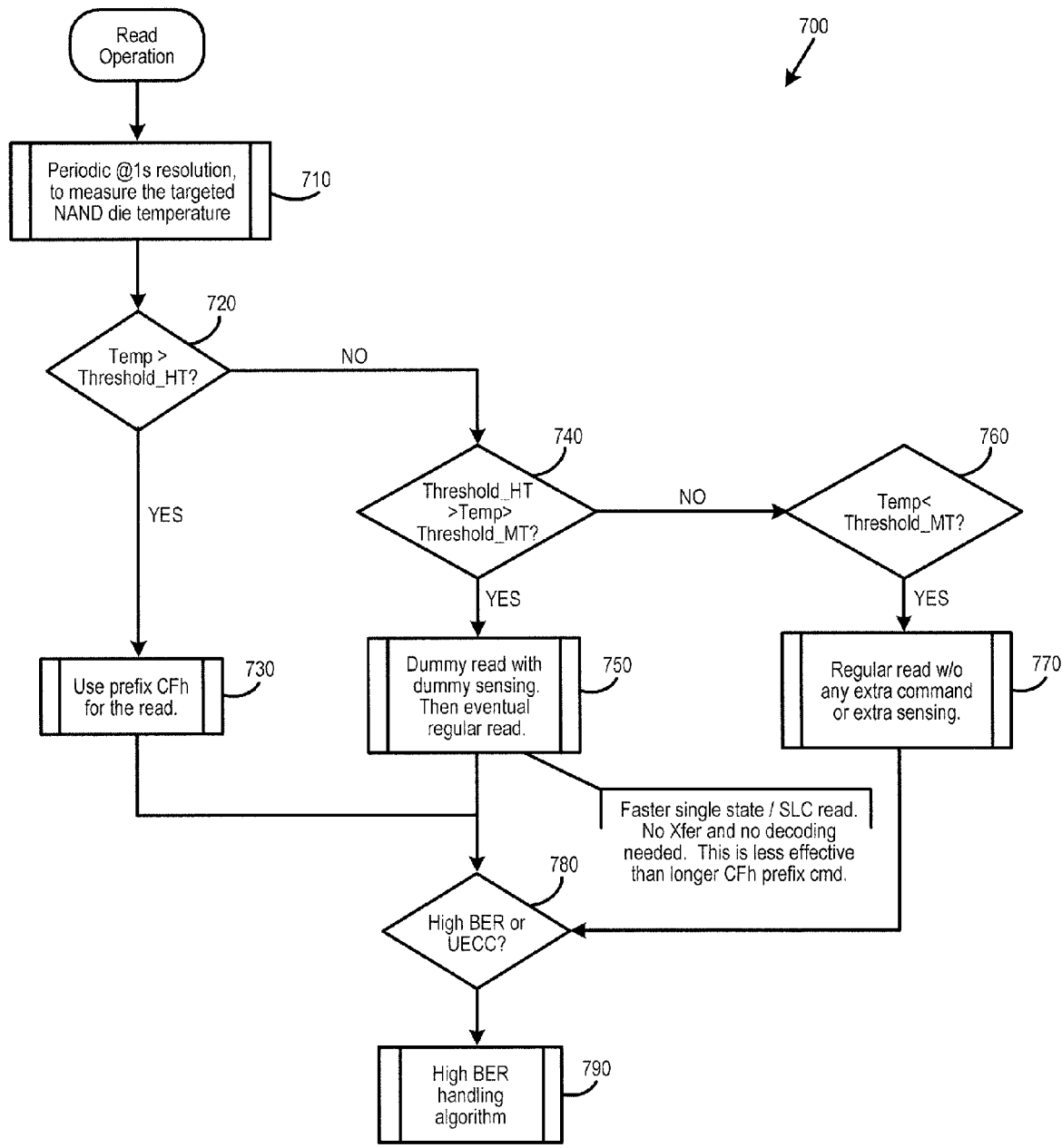
FIG. 7 is a flow chart of a method of an embodiment for temperature throttling for block reading.

FIG. 7 is a flow chart 700 of a method of an embodiment for temperature throttling for block reading. In one embodiment, this method is performed during a read operation (e.g., CVD tracking or dynamic read) that is optimized for second read conditions on a block. The read operation can be applied to the block randomly. As shown in FIG. 7, the controller 102 periodically (e.g., a one second resolution in situations where there is a 1° C. increase in temperature per second) measures the targeted memory die temperature (act 710). This can be performed, for example, by the temperature measurement module 111 in the controller 102 reading the temperature reading in the temperature sensor 153 of a selected memory die 104, so that the die 104 has its temperature value supplied to the system read operation algorithm.

Next, the controller 102 determines whether the read temperature is greater than a first threshold temperature (Threshold_HT) (or is in a first temperature range (e.g., >Threshold_HT) (act 720). "HT stands for "high temperature" and, in one embodiment, is 80° C. If the controller 102 determines that the read temperature is greater than a first threshold temperature (Threshold_HT), the controller 102 applies a relatively-high voltage (e.g., a short pulse (~100 us) of 8 V, where a normal read is 6 V) to the plurality of word lines, e.g., by using the CFh prefix, before reading one of the plurality of word lines in a block of memory being read (act 730). In operation, when the memory die 104 receives the CFh prefix, the value of 8 V can be stored in the trim register 370, and the state machine 153 will apply 8 V across all the word lines.

As mentioned above, applying a voltage on a word line to read a memory cell causes ambient electrons to be attracted into the shallow trap of the memory cell, which can reduce the failed bit count from the first read mode region to the desired second read mode region. By applying a voltage on all of the word lines (not just the word line that needs to be read), the controller 102 causes the failed bit count of all the word lines to decrease because all the word lines will transition from the first read mode back to second read mode. After the voltage is applied on all the word lines (preconditioned the word lines), the targeted word line is then read. If additional word lines need to be read (e.g., if there is a sequential read), those additional word lines are read without having to apply another pulse on all the word lines.

Applying a high voltage across all the word lines consumes a relatively-high amount of power. So, it may be considered undesirable to expend that much power before every read operation. In this embodiment, this expenditure is done when the temperature is high enough to warrant it. As was shown in FIG. 5, the transition from the second read mode to the first read mode occurs more quickly as temperature increases. So, when the memory is at a relatively-high temperature, the block has been heating up, and it is likely that many, if not all, of the word lines have transitioned from the second to the first read mode. It is possible that any given word line might have been recently read and, therefore, would not need to have voltage applied to it (because the read voltage already caused the word line to transition from the first read mode to the second read mode). However, the controller 102 in this embodiment does not track when a previous read occurred to any given word line (e.g., by using a timer on every memory block to determine the time the block was last accessed). So, to be on the safe side, the controller 102 assumes that there wasn't a recent read and the voltage needs to be applied to pre-condition the block to read. In this embodiment, voltage is applied to all the word lines instead of an individual word line to avoid needing to repeatedly perform this voltage applying step for every word line to be read in a sequential read operation. Also, if the storage system 100 has thermal throttling protection to avoid overheating, thermal throttling may be activated at this temperature as well. Thus, a performance glitch is not a serious concern here for the high temperatures.

Returning to act 720, if the controller 102 determines whether the read temperature is not greater than a first threshold temperature (Threshold_HT), the controller 102 then determines if the read temperature is greater than a second threshold (Threshold_MT) (in a second temperature range) (act 740). "MT stands for "medium temperature" and, in one embodiment, is 40° C. At medium temperature, the memory block has been heating up but has probably not transitioned from the second read mode to the first read mode. Accordingly, if the read temperature is above the second threshold, there is probably no need to apply voltage across all the word lines (e.g., using a CFh command). Instead, the controller 100 can just perform a dummy read with dummy sensing on one of the word lines and then perform a regular read on the word line (act 740). A dummy read can be a faster (e.g., ~40 us) single state/SLC read with no data transfer and no decoding. A dummy read is less effected and longer than a CFH prefix command but consumes less power, as it applies less voltage (e.g., 6 V instead of 8 V) on one (or more) word lines instead of all the word lines. The idea here is that, since the temperature is lower, it is less likely that the word line is in the first read mode. Accordingly, this embodiment attempts to balance the power costs and BER benefits by using a less effective, targeted application of voltage, which while not as effective as a relatively-high voltage burst across all word lines, may be sufficient to bring a word line that may or may not be in the first read mode back to the second read mode. If additional word lines are to be read in this case, the dummy read would be performed on a word-line-by-word-line basis. However, in one embodiment, if the word line is successfully read with a failed bit count in the second read mode region, dummy reads are not performed for additional word lines that are part of a sequential read operation.

Returning to act 740, if the controller 102 determines whether the read temperature is not greater than a second threshold temperature (Threshold_MT), the controller 102 determines that the read temperature is lower than the second threshold (Threshold_MT) (in a third temperature range) (act 760) and performs a regular read without any extra command or extra sensing (act 770). In this situation, the memory 104 is at lower temperature (e.g., 25C), and the memory block has probably not been heating up enough to cause a transition from the second read mode to the first read mode.

After the read is performed in any of these three possible scenarios, the controller 102 determines if there is a high bit-error rate (BER) or an uncorrectable ECC error (act 780). If there is, the controller performs a high BER handing algorithm to handle the error.

There are several advantages associated with these embodiments. For example, these embodiments can provide an intelligent approach to handle block BER at read as a preventative measure against the temperature-dependent first read mode issue for memories, such as three-dimensional BiCS memory, leading to less overhead for ECC and high BER handling by the system, thus enhancing the performance. These embodiments can also help reduce defective parts per million (DPPM) due to read failure and reduce unnecessary read error handling or high BER handling because it can keep the read parameters optimized for a given block at all temperatures, thus enhancing the read performance as well.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A storage system comprising:
a memory comprising a plurality of word lines; and
a controller in communication with the memory, wherein the controller is configured to:
   determine whether a temperature of the memory is above a first threshold temperature; and
   in response to determining that the temperature of the memory is above the first threshold temperature:
      apply a first voltage to the plurality of word lines of a block in the memory being read; and
      after the first voltage has been applied to the plurality of word lines:
         apply a second voltage to one of the plurality of word lines, wherein the first voltage is at least as high as the second voltage; and
         read a memory cell on the one of the plurality of word lines.

2. The storage system of claim 1, wherein the controller is configured to apply the first voltage to the plurality of word lines by sending a pre-conditioning command prior to a read command.

3. The storage system of claim 1, wherein the controller is further configured to:
in response to determining that the temperature of the memory is below the first threshold temperature but above a second threshold:
   perform a dummy read of a memory cell on one of the plurality of word lines; and
   after the dummy read has been performed, perform an actual read of the memory cell on the one of the plurality of word lines.

4. The storage system of claim 3, wherein the controller is further configured to perform the dummy read by performing a single level cell sensing without a data transfer.

5. The storage system of claim 3, wherein the memory array is more likely to contain a higher error rate at the first threshold temperature than at the second threshold temperature.

6. The storage system of claim 3, wherein the controller is further configured to:
in response to determining that the temperature of the memory is below the second threshold, perform an actual read of the memory cell on the one of the plurality of word lines without pre-applying a voltage to the plurality of word lines or performing a dummy read of the memory cell on the one of the plurality of word lines.

7. The storage system of claim 1, wherein the memory comprises a three-dimensional memory.

8. The storage system of claim 1, wherein the storage system is embedded in a host.

9. The storage system of claim 1, wherein the storage system is removably connected to a host.

10. A method comprising:
performing the following in a storage system comprising a memory having a plurality of word lines:
detecting a temperature of the memory;
determining whether the temperature is in a first temperature range; and
in response to the temperature of the memory being in the first temperature range:
transitioning the plurality of word lines from a first read mode to a second read mode by applying a first voltage to the plurality of word lines; and
after the plurality of word lines have been transitioned from the first read mode to the second read mode:
applying a second voltage to one of the plurality of word lines, wherein the first voltage is at least as high as the second voltage; and
reading a memory cell on the one of the plurality of word lines.

11. The method of claim 10 further comprising:
determining whether the temperature is in a second temperature range; and
in response to the temperature of the memory being in the second temperature range, pre-conditioning one of the plurality of word lines by applying a pre-read voltage to the one of the plurality of word lines before applying a read voltage to read the memory cell on the one of the plurality of word lines.

12. The method of claim 11, wherein the memory array is more likely to contain a higher error rate at the first temperature range than at the second temperature range.

13. The method of claim 11, further comprising:
determining whether the temperature is in a third temperature range; and
in response to the temperature of the memory being in the third temperature range, reading the memory cell on the one of the plurality of word lines without attempting to transition the one of the plurality of word lines from the first read mode to the second read mode.

14. The method of claim 10, wherein the memory comprises a three-dimensional memory.

15. The method of claim 10, wherein the storage system is embedded in a host.

16. The method of claim 10, wherein the storage system is removably connected to a host.

17. A storage system comprising:
a memory comprising a plurality of word lines;
means for determining that the temperature of the memory is above the first threshold temperature:
means for applying a first voltage to the plurality of word lines of a block in the memory being read; and
means for after the first voltage has been applied to the plurality of word lines:
applying a second voltage to one of the plurality of word lines, wherein the first voltage is at least as high as the second voltage; and
reading a memory cell on the one of the plurality of word lines.

18. The storage system of claim 17, wherein the memory comprises a three-dimensional memory.

19. The storage system of claim 17, wherein the storage system is embedded in a host.

20. The storage system of claim 17, wherein the storage system is removably connected to a host.

* * * * *